United States Patent
Blank

(10) Patent No.: US 8,188,567 B2
(45) Date of Patent: May 29, 2012

(54) SEMICONDUCTOR DEVICE AND METHOD FOR MANUFACTURING

(75) Inventor: Oliver Blank, Nittendorf (DE)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 12/976,198

(22) Filed: Dec. 22, 2010

(65) Prior Publication Data
US 2011/0089527 A1   Apr. 21, 2011

Related U.S. Application Data

(62) Division of application No. 12/355,343, filed on Jan. 16, 2009, now Pat. No. 7,879,686.

(51) Int. Cl.
*H01L 29/00*   (2006.01)
(52) U.S. Cl. .................. 257/520; 257/E29.017
(58) Field of Classification Search .................. 257/520, 257/E29.1
See application file for complete search history.

(56) References Cited

U.S. PATENT DOCUMENTS

| | | | |
|---|---|---|---|
| 7,361,555 B2 | 4/2008 | Koops et al. | |
| 2007/0077711 A1 | 4/2007 | Wang et al. | |
| 2008/0135889 A1 | 6/2008 | Session | |
| 2009/0224316 A1 | 9/2009 | Bhalla et al. | |
| 2011/0312166 A1* | 12/2011 | Yedinak et al. | 438/488 |

OTHER PUBLICATIONS

Notice of Allowance mailed Sep. 22, 2010 for U.S. Appl. No. 12/355,343.

* cited by examiner

*Primary Examiner* — David S Blum
(74) *Attorney, Agent, or Firm* — Dicke, Billig & Czaja, PLLC

(57) ABSTRACT

A semiconductor and method for manufacturing a semiconductor device. In one embodiment the method includes providing a semiconductor substrate with a first substrate surface and at least one trench having at least one trench surface. The trench extends from the first substrate surface into the semiconductor substrate. The trench has a first trench section and a second trench section. The trench surface is exposed in an upper portion of the first and second trench sections and covered with a first insulating layer in a lower portion. A second insulating layer is formed at least on the exposed trench surface in the upper portion. A conductive layer is formed on the second insulating layer at least in the upper portion, wherein the second insulating layer electrically insulates the conductive layer from the semiconductor substrate. The conductive layer is removed in the first trench section without removing the conductive layer in the second trench section.

9 Claims, 13 Drawing Sheets

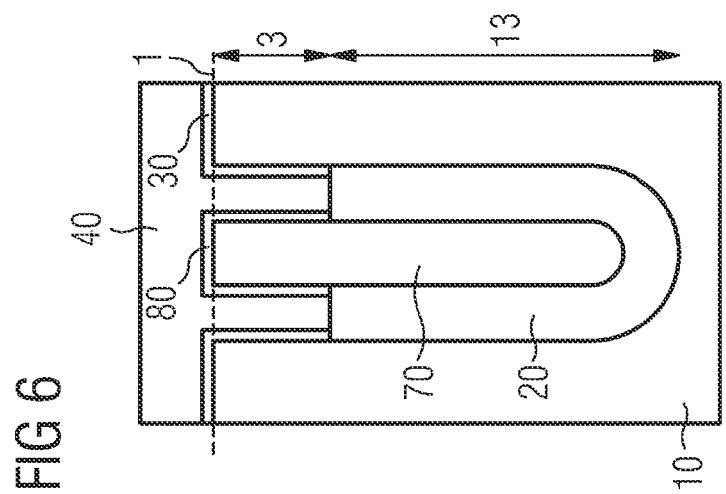
FIG 6
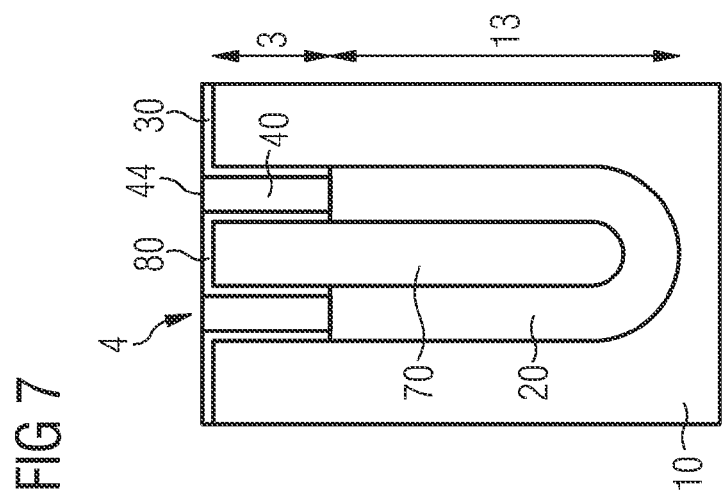
FIG 7
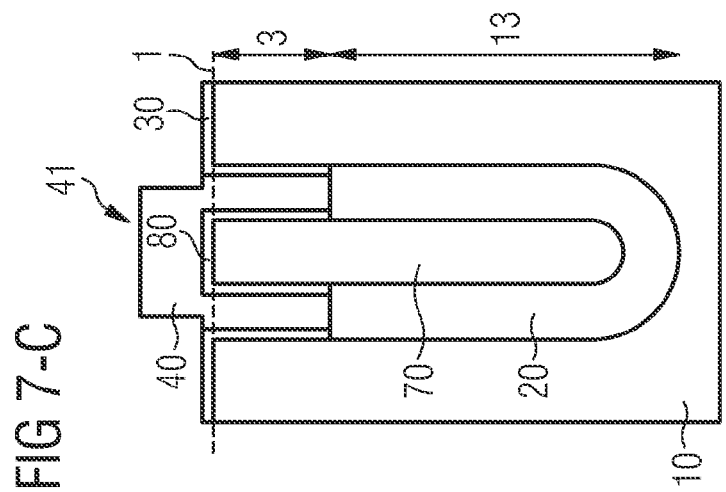
FIG 7-C

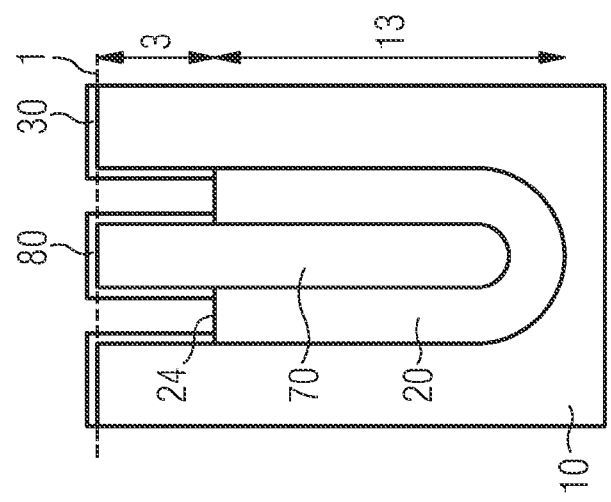
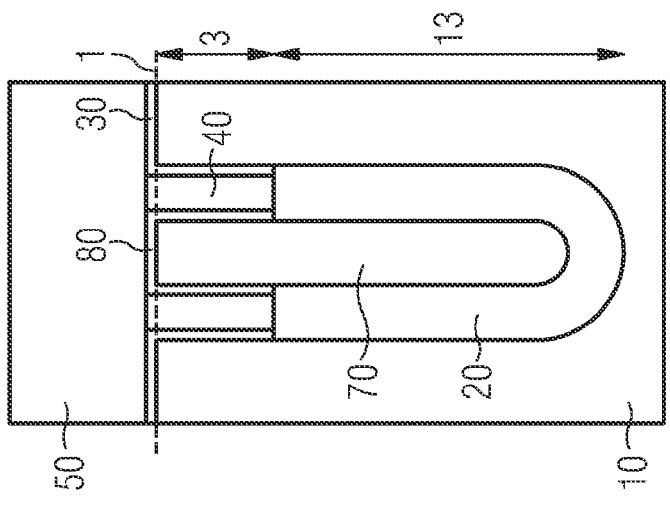
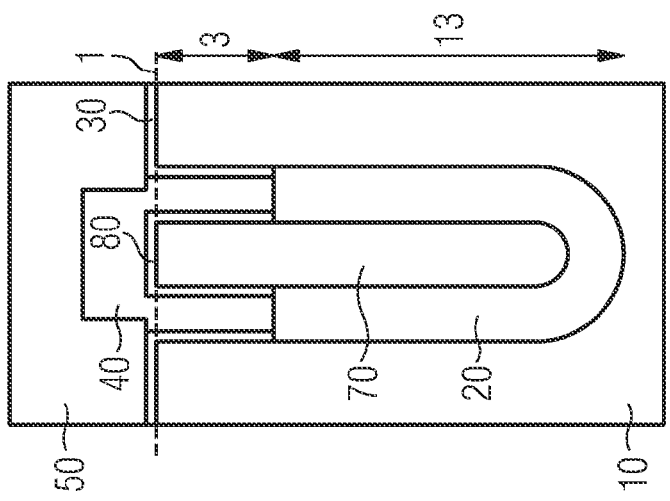

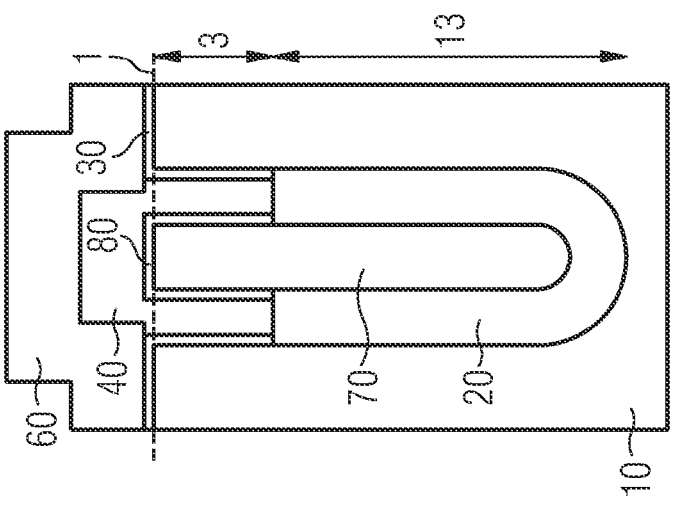
FIG 9-I
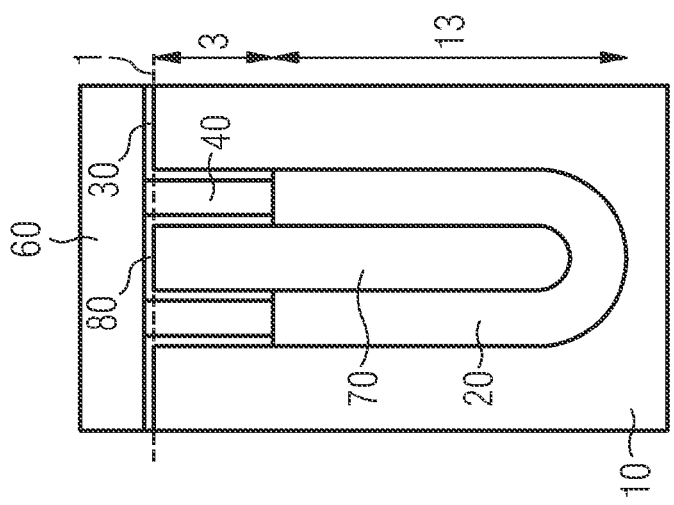
FIG 9-II
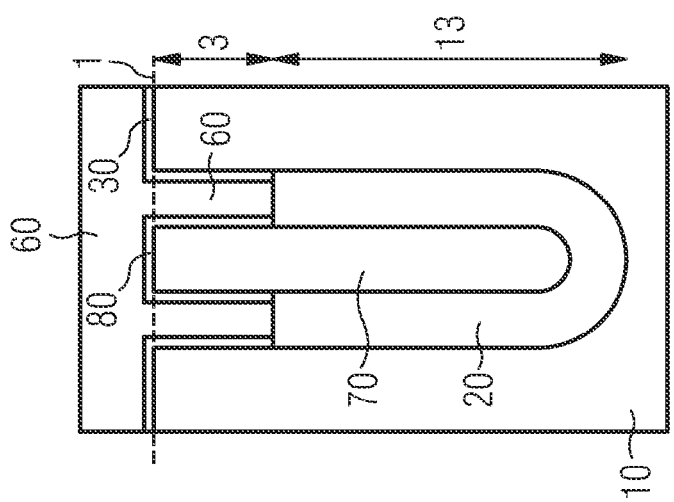
FIG 9-C

FIG 10-A
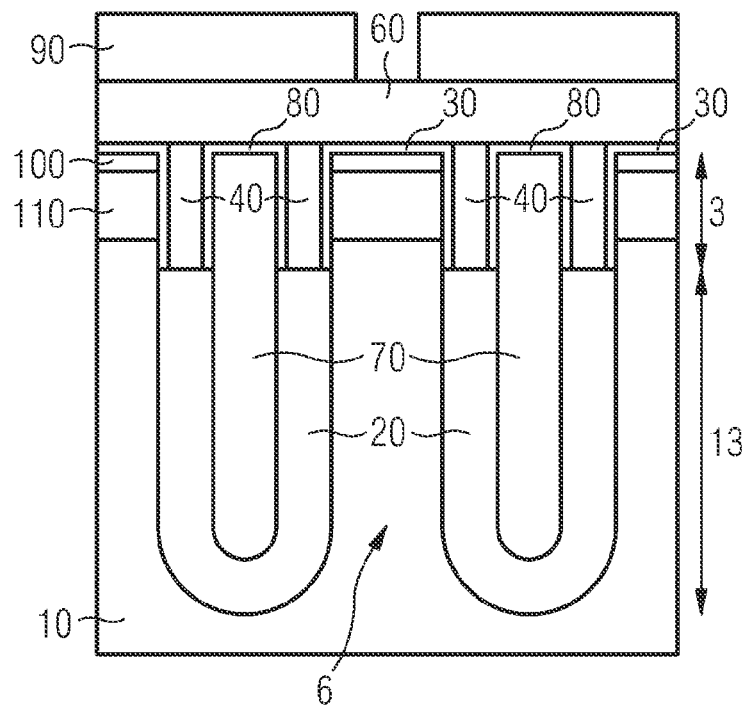
FIG 10-B
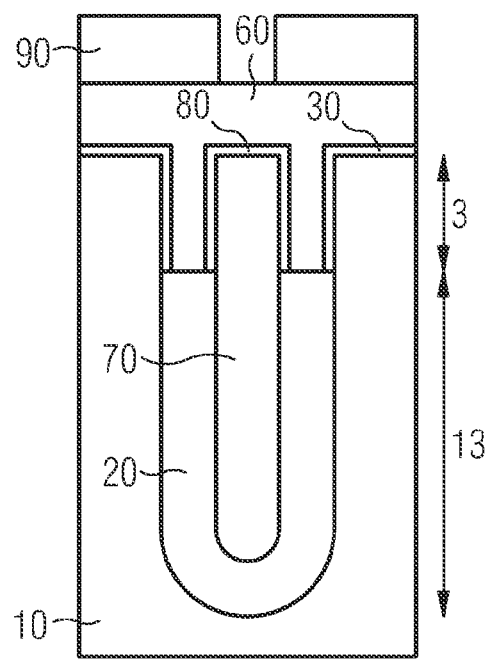
FIG 10-C
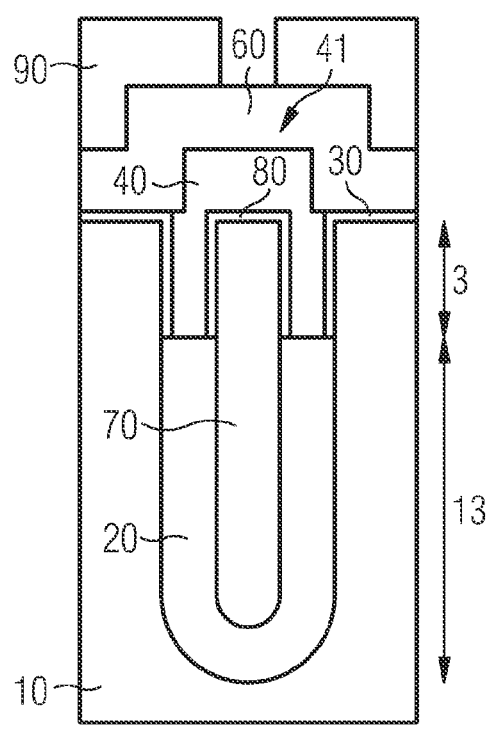

FIG 11-A
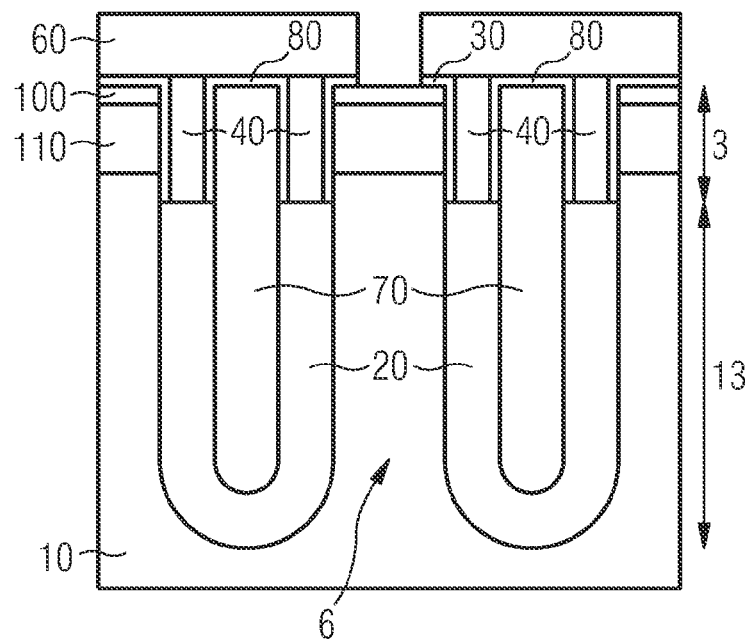
FIG 11-B
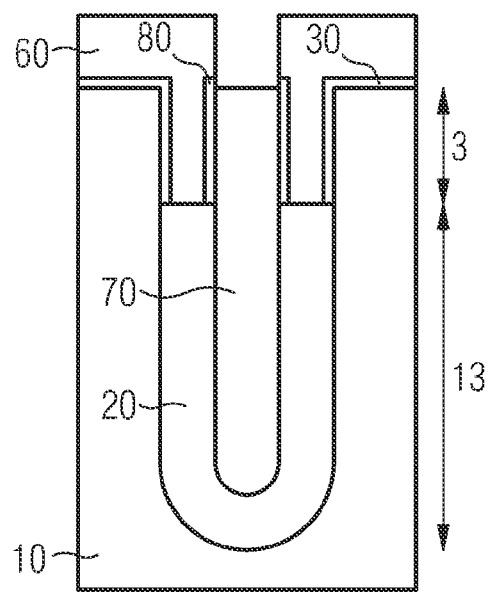
FIG 11-C
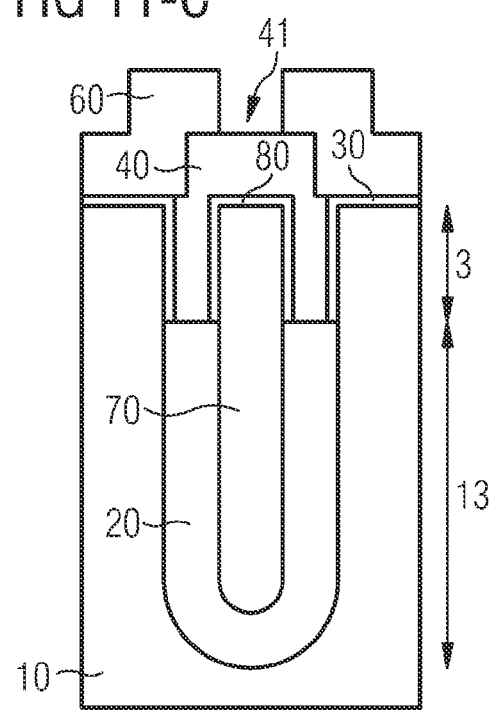

FIG 12-A
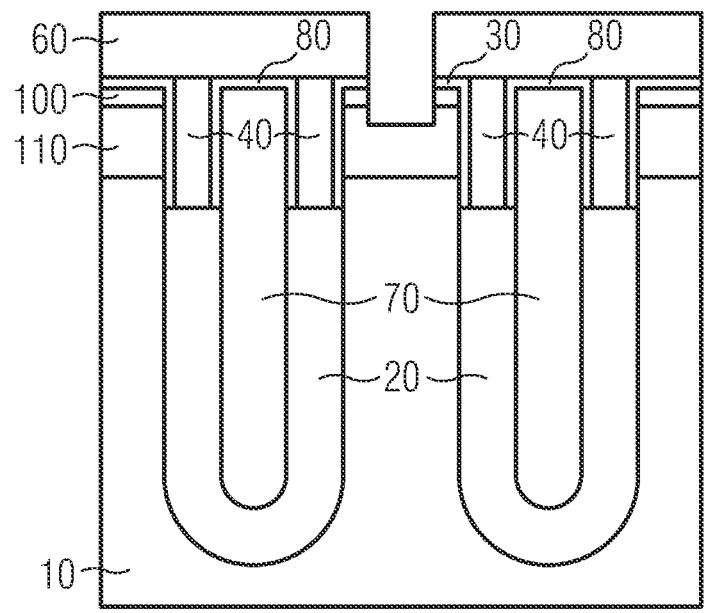
FIG 12-B
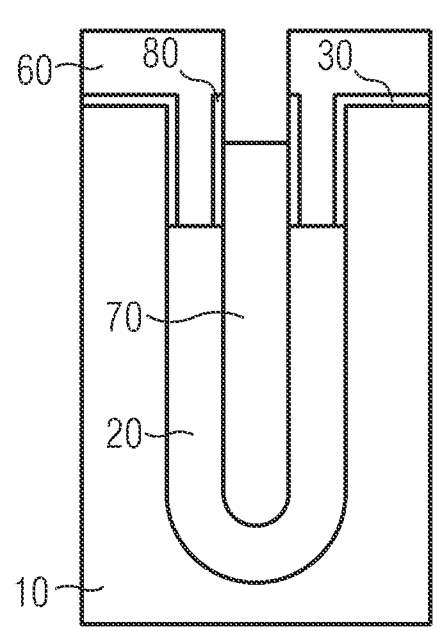
FIG 12-C
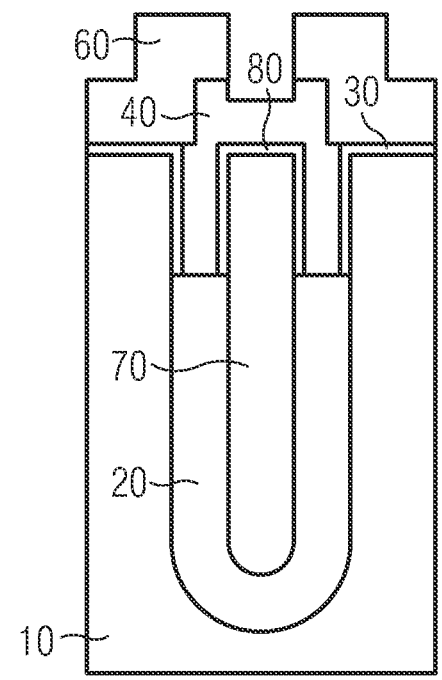

FIG 13-A
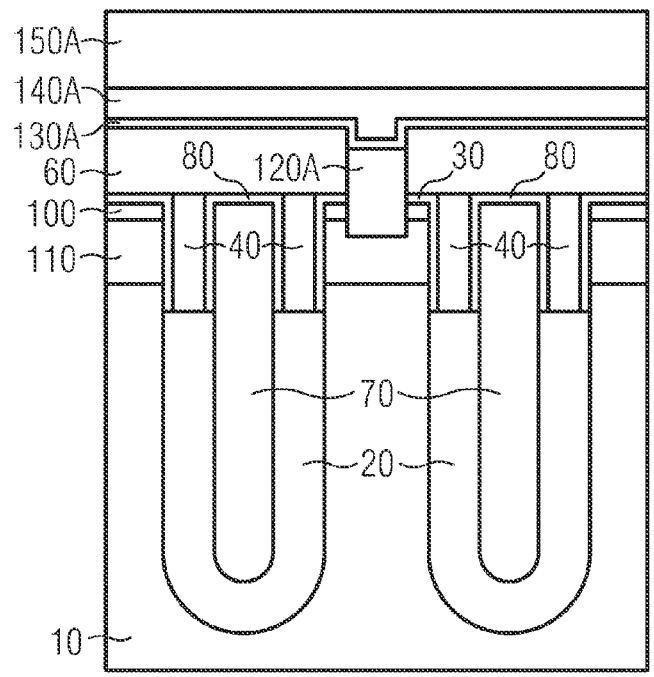
FIG 13-B
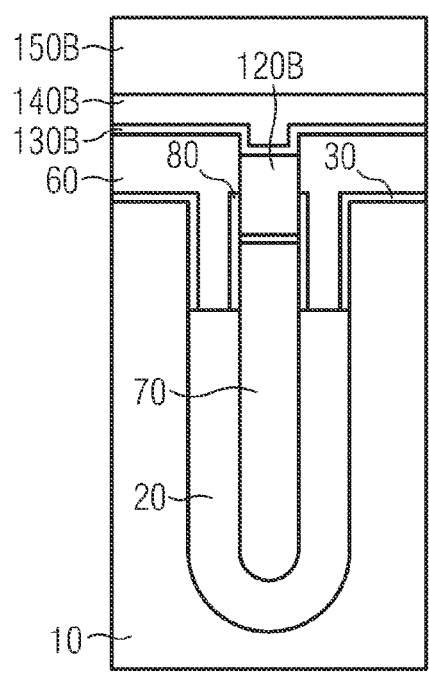
FIG 13-C
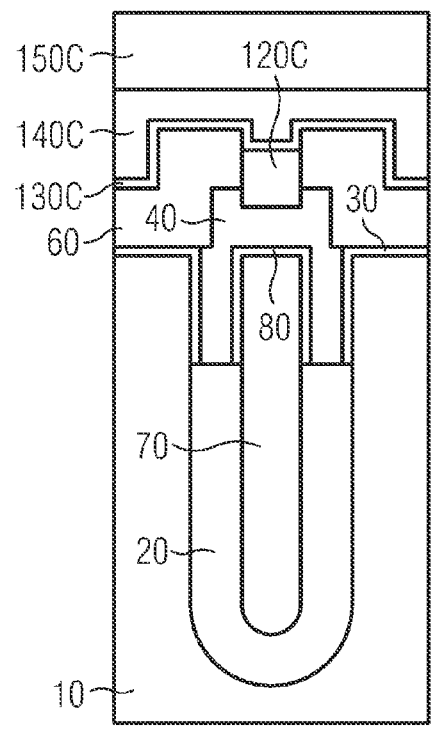

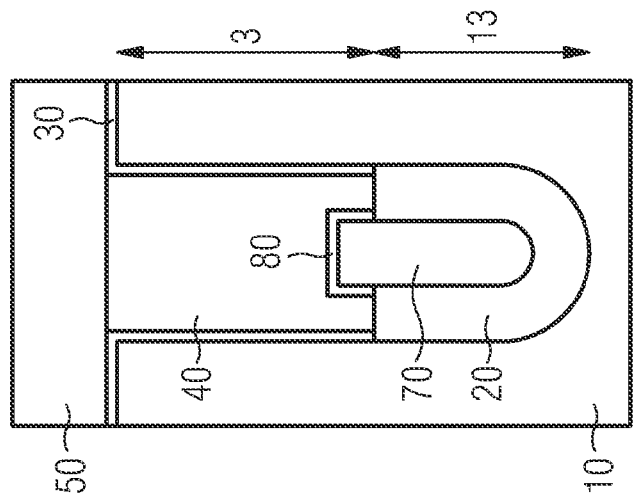
FIG 17
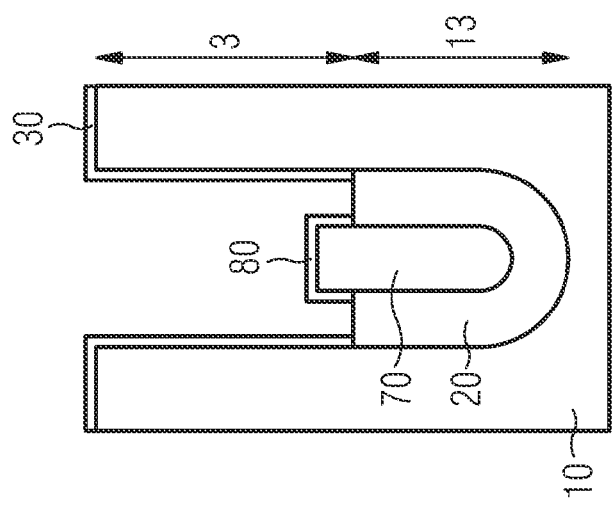
FIG 18-I
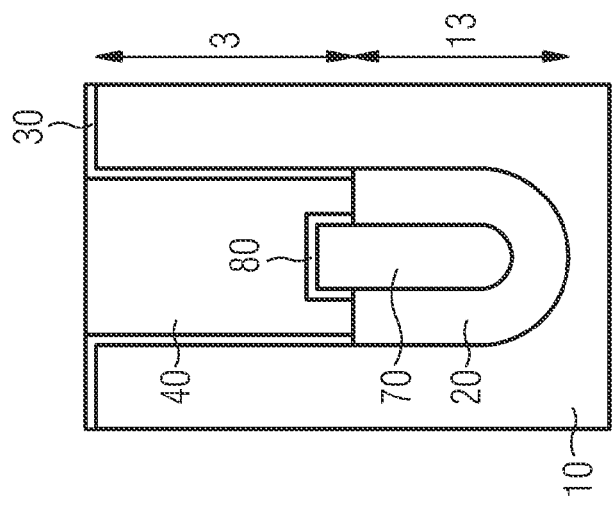
FIG 18-II

FIG 19-I
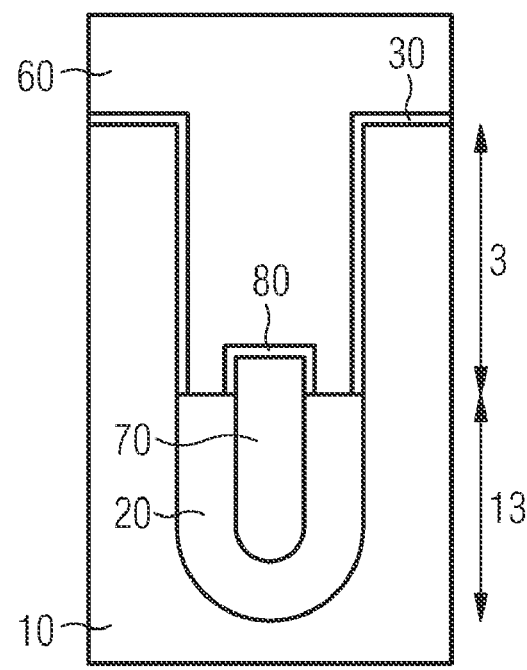
FIG 19-II
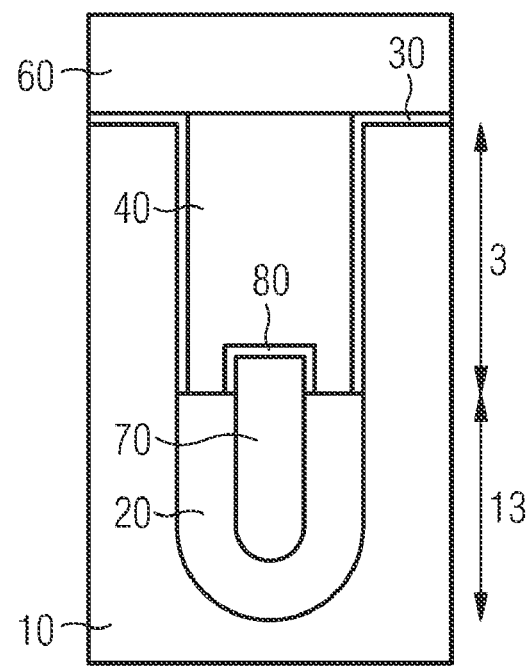

SEMICONDUCTOR DEVICE AND METHOD FOR MANUFACTURING

CROSS-REFERENCE TO RELATED APPLICATIONS

This Utility Patent Application is a divisional application of U.S. application Ser. No. 12/355,343, now U.S. Pat. No. 7,879,686, filed Jan. 16, 2009, which is incorporated herein by reference.

BACKGROUND

One or more embodiments relate to a semiconductor device, in particular to a trench semiconductor device, in one embodiment a power semiconductor device. One or more embodiments also relate to a method of manufacturing a semiconductor device, a trench semiconductor device, in one embodiment a power semiconductor device.

Semiconductor devices using trench technology are used in a plurality of industrial fields. In particular, power semiconductor devices are used, e.g., in motor drive circuits, appliance controls, robotics and lighting ballasts.

In general, semiconductor devices using trench technology offer a significantly increased channel width per unit area as compared to planar devices, thereby enabling a higher load current per unit area. Further, semiconductor devices with trench technology offer superior switching characteristics and are often used in applications which demand fast switching. For example, a power FET usually has a source region near a first surface of a semiconductor substrate and a drain region near a second surface of the semiconductor substrate, while the gate is located in a trench extending downward from the first surface. The gate is normally insulated from the semiconductor substrate by a thin gate oxide layer. As the capacitance of the capacitor, formed by gate and semiconductor substrate with the gate oxide layer as dielectric in-between, is small, only small gate currents for charging and discharging the capacitor are needed, which results in fast switching.

A thin gate oxide layer may increase the leakage currents from the gate to other parts of the semiconductor device. In particular, defects of the gate oxide layer can be a weak point of the semiconductor device reducing its reliability and increasing defect rates.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3 to 7 illustrate cut views through a trench of a semiconductor device at different stages of a manufacturing method according to one or more embodiments.

FIG. 7-C illustrates cut view as in FIG. 7 along the line C of FIG. 1.

FIG. 8-I illustrates a cut view through a trench in the first trench section I of FIG. 1 at a stage of a manufacturing method according to one or more embodiments.

FIG. 8-II illustrates a cut view through a trench in the first trench section II of FIG. 1 at a stage of a manufacturing method according to one or more embodiments.

FIG. 8-C illustrates a cut view as in FIG. 8-II along the line C of FIG. 1.

FIGS. 9-I to 9-C illustrate cut views as in FIGS. 8-I to 8-C at a different stage of a manufacturing method according to one or more embodiments.

FIGS. 10-A to 13-A illustrate cut views through trenches of a semiconductor device along line A of FIG. 1 at different stages of a manufacturing method according to one or more embodiments.

FIGS. 10-B to 13-B illustrate cut views through trenches of a semiconductor device along line B of FIG. 1 at different stages of a manufacturing method according to one or more embodiments.

FIGS. 10-C to 13-C illustrate cut views through trenches of a semiconductor device along line C of FIG. 1 at different stages of a manufacturing method according to one or more embodiments.

FIGS. 14 to 17 illustrate cut views through a trench of a semiconductor device with buried field plate at different stages of a manufacturing method according to one or more embodiments.

FIGS. 18-I and 18-II and 19-I and 19-II, illustrate cut views through a trench of a semiconductor device with buried field plate in the first and second trench sections I and II of FIG. 1 at a stage of a manufacturing method according to one or more embodiments.

DETAILED DESCRIPTION

Figure 1A:
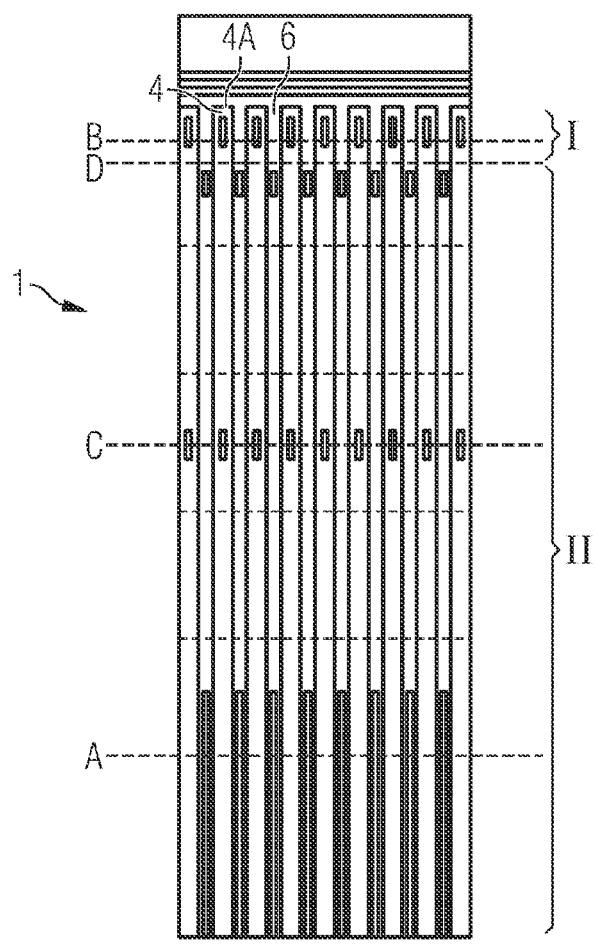
FIG. 1A illustrates, in a top view, a layout of a semiconductor device according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The directional term "longitudinal", as referred to herein, shall indicate a direction along the length of a trench structure while the directional term "lateral" shall indicate a direction transverse to the longitudinal direction, i.e., along the width of a trench structure. Typically, a semiconductor substrate, e.g., a wafer or chip, includes two opposing, parallel surfaces, namely a first substrate surface, which will also be referred to as front surface, and a second substrate surface, which will also be referred to as back surface. The first and second substrate surfaces are to be considered as planes, irrespective of whether, e.g., a trench structure formed in the semiconductor substrate. A trench structure typically extends from the first substrate surface towards the second substrate surface in a direction which is usually normal to the first substrate surface. This direction will be referred to as "vertical" direction and represents an oriented direction, the positive vertical direction pointing from the first substrate surface to the second substrate surface. The depth of a trench structure is determined along the positive vertical direction starting from the first substrate surface. The term "below" shall be understood as "at a greater distance in positive vertical direction". Conversely, the term "above" shall be understood as "at a greater distance in negative vertical direction". Longitudinal and lateral directions span any plane parallel to the first and/or second substrate surface. If the trench structure includes vertical sidewalls, the lateral direction is normal to the sidewalls.

The terms "deposition oxide layer" and "thermal oxide layer" as used herein refer to oxide layers formed by a deposition process and a thermal oxidation process, respectively. However, the two terms describe material properties of a semiconductor device. Even if respective oxides consist of the same chemical material, an oxide layer formed by deposition may be distinguished from an oxide layer formed by thermal oxidation through their structures, e.g., by a suitable cut and SEM imaging. In SEM imaging, thermal oxide can, for example, be distinguished from deposition oxide by the different geometry of edges and corners, thermal oxide forming rounded edges and corners. Further, thermal oxide and deposition oxide have different etch rates under wet-chemical etching. After suitable preparation by etching, thermal oxide may hence be distinguished from deposition oxide by SEM imaging.

Herein described are method for forming semiconductor devices, in one or more embodiments field-effect semiconductor devices, which include formation of a gate insulating in a second trench section before formation of gate field insulating layer in a first trench section. The gate insulating layer extends from the first to the second trench section and is covered by the field insulating layer in the first trench section. The method includes providing a semiconductor substrate with a first substrate surface and at least one trench having at least one trench surface. The trench extends from the first substrate surface into the semiconductor substrate and runs in a longitudinal direction. The trench has a first trench section and a second trench section arranged adjacent, in the longitudinal direction, to the first trench section. The trench surface is exposed in an upper portion of the first and second trench sections and covered with a first insulating layer in a lower portion of the first and second trench sections. A second insulating layer is formed at least on the exposed trench surface in the upper portion of the first and second trench sections. A conductive layer is formed on the second insulating layer at least in the upper portion of the first and second trench sections, wherein the second insulating layer electrically insulates the conductive layer from the semiconductor substrate. The conductive layer is removed from the first trench section without removing the conductive layer in the second trench section. A third insulating layer is formed at least in the first trench section. Typically, the third insulating layer fills the space in the upper portion of the first trench section from which the conductive layer was removed so that the third insulating layer in the first trench section and the conductive layer in the second trench section have the same lateral thickness.

According to one or more embodiments, a method for manufacturing a semiconductor device is provided, the method includes providing a semiconductor substrate having a first substrate surface; forming at least one trench having at least one substantially vertical trench surface in the semiconductor substrate, wherein the trench runs in a longitudinal direction and has a first trench section and a second trench section longitudinally adjacent to the first trench section; forming a field insulating layer on the trench surface in a lower portion of the first and second trench sections; forming a gate insulating layer on the trench surface in an upper portion of the first and second trench sections; forming a gate electrode layer on the gate insulating layer at least in the upper portion of the first and second trench sections; removing the gate electrode layer from the first trench section; and forming an insulating layer on the gate insulating layer in the upper portion of the first trench section.

According to one or more embodiments, a method for manufacturing a semiconductor device is provided, the method includes providing a semiconductor substrate having a first substrate surface; forming at least one trench with at least one substantially vertical trench surface in the semiconductor substrate, wherein the trench runs in a longitudinal direction and has a first trench section and a second trench section longitudinally adjacent to the first trench section; forming a field insulating layer on the trench surface in the first and second trench sections; forming a field plate layer in the trench on the field insulating layer; removing the field insulating layer from an upper portion of the trench in the first and second trench sections to expose the trench surface and the field plate layer in the upper portion; forming a gate insulating layer at least on the exposed trench surface in the upper portion of the first and second trench section and forming a field plate insulating layer at least on the exposed portions of the field plate layer in the upper portion of the first and second trench sections; forming a gate electrode layer between the field plate insulating layer and the gate insulating layer at least in the upper portion of the second trench section; forming an insulating layer between the field plate insulating layer and the gate insulating layer at least in the upper portion of the first trench section.

According to one or more embodiments, a power field effect device is provided which includes an epitaxial semiconductor region having at least one trench with a trench surface at least in a field oxide section and in an adjacent gate oxide section; a field oxide layer covering the trench surface in a lower portion of the field oxide section and the gate oxide section; a gate oxide layer covering the trench surface in an upper portion of the field oxide section and the gate oxide section; a gate electrode in the gate oxide section, the gate oxide layer electrically insulating the epitaxial semiconductor region from the gate electrode; wherein the gate oxide layer has a constant thickness in longitudinal direction at least across a transition between the field oxide section and the gate oxide section.

Embodiments will typically be described with reference to n-channel semiconductor devices. Embodiments are not limited to n-channel semiconductor devices and may include p-channel semiconductor devices. Embodiments will typically be described with reference to field effect transistors such as power field effect transistors. However, in further embodiments, which may be combined with embodiments described herein, diodes, bipolar transistors and insulated gate bipolar transistors (IGBTs) are provided.

According to one or more embodiments, a method for manufacturing a semiconductor device is provided. The method includes providing a semiconductor substrate. The semiconductor substrate, typically a semiconductor wafer, may include a drain region, typically if the semiconductor device includes a transistor such as a field effect transistor. In an n-channel semiconductor device the drain region is typically of n type. In case of an IGBT, the semiconductor substrate typically includes a p-type emitter region. The semiconductor substrate may include at least one of the following materials: Si, SiC, and GaN. The drain or emitter regions can also be formed at a later stage.

According to one or more embodiments, the semiconductor substrate includes an epitaxially grown semiconductor region. Typically, an epitaxial semiconductor region forms a drift region. In an n-channel semiconductor device the epitaxial semiconductor region is typically of n type. In one or more embodiments, the epitaxial region is not as highly doped as the drain region. The epitaxial region may have a homogeneous doping concentration or an inhomogeneous doping concentration such as a gradient doping. The epitaxial semiconductor layer may include at least one of the following materials: Si, SiC, and GaN.

In one or more embodiments, the semiconductor substrate includes a first substrate surface. Typically, the first substrate surface is the outer surface of the epitaxial semiconductor region. The semiconductor substrate may also include a second substrate surface, typically the outer surface of the drain or emitter region.

According to one or more embodiments, the semiconductor substrate includes at least one trench. The trench may include at least one trench surface. The trench extends from the first substrate surface into the semiconductor substrate. In embodiments, the trench extends substantially vertically into the semiconductor substrate. The trench may include at least one trench surface or at least one trench surface part or portion which is substantially vertical, e.g., at least one sidewall. The trench may include a bottom part with a trench surface or trench surface part, which is substantially horizontal or of other shape, e.g., rounded. In one or more embodiments, the trench extends into the epitaxial semiconductor region or penetrates it and reaches the wafer. According to one or more embodiments, the trench is formed by etching. The trench surface typically includes the whole inner surface of the trench, i.e. particularly the two oppositely arranged trench walls and the trench bottom.

According to one or more embodiments, the trench includes a first trench section and a second trench section. Typically, the first trench section is arranged adjacent to the second trench section in the longitudinal direction of the trench, i.e., as seen along the length of the trench. Typically, the first and second trench sections have a common transition region. The transition region may extend in substantially lateral and vertical directions. In one or more embodiments, the first trench section is a field oxide section, and the second trench section is a gate oxide section, which includes a gate oxide and a gate as described further below.

In one or more embodiments, the semiconductor substrate includes a plurality of trenches. The trenches may be of the same shape and formation. At least some of the trenches and/or at least some of the structures formed in the trenches may differ, e.g., channel stop trenches in boundary regions of the semiconductor substrate.

According to one embodiment, a method for manufacturing a semiconductor device is provided. The method includes providing a semiconductor substrate with a first substrate surface and at least one trench having at least one trench surface. The trench extends from the first substrate surface into the semiconductor substrate and runs in a longitudinal direction. The trench has a first trench section and a second trench section arranged adjacent, in the longitudinal direction, to the first trench section. The trench surface is exposed in an upper portion of the first and second trench sections and covered with a first insulating layer in a lower portion of the first and second trench sections. A second insulating layer is formed at least on the exposed trench surface in the upper portion of the first and second trench sections. A conductive layer is formed on the second insulating layer at least in the upper portion of the first and second trench sections, wherein the second insulating layer electrically insulates the conductive layer from the semiconductor substrate. The conductive layer is removed in the first trench section without removing the conductive layer in the second trench section. A third insulating layer is formed at least in the first trench section.

FIG. 1A illustrates a top view of a semiconductor device according to one or more embodiments. FIG. 1A illustrates a first substrate surface 1, i.e. the front or upper surface, of a semiconductor device. In FIG. 1A, a trench structure with nine trenches 4 is illustrated. A trench 4 includes a trench end 4A. The trench structure may include mesa structures 6, i.e., semiconductor regions between adjacent trenches 4. Each trench 4 includes a first trench section I adjacent in longitudinal direction to a second trench section II. The boundary or transition between the first trench section I and the second trench section II is labelled by D.

Figure 1B:
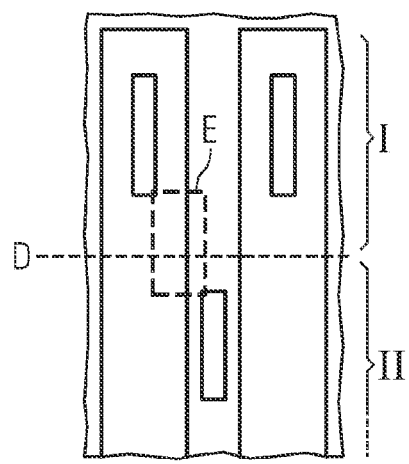
FIG. 1B illustrates a section of FIG. 1A.

FIG. 1B is an enlarged part of FIG. 1A illustrating two trenches. Area E is outlined at boundary D between section I and section II.

FIGS. 2A to 2F illustrate perspective views illustrating a method for manufacturing a semiconductor device according to one or more embodiments. The semiconductor device includes at least one trench. The longitudinal extension of the trench runs from left to right in FIGS. 2A to 2F.

Figure 2A:
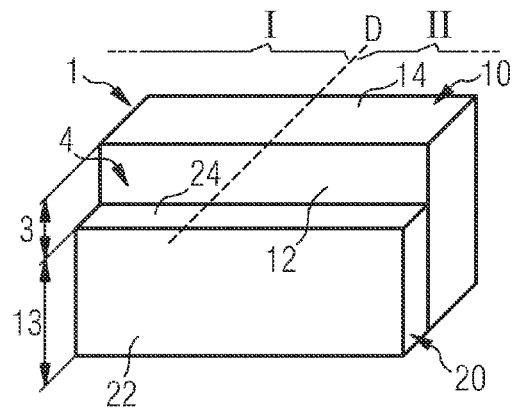
FIGS. 2A to 2F illustrate a method for manufacturing a semiconductor device according to one or more embodiments.

As illustrated in FIG. 2A, a semiconductor substrate 10 is provided. The semiconductor substrate 10 may include an epitaxial semiconductor region or a bulk wafer substrate. An upper surface 14 of the semiconductor substrate 10 forms at least part of the first substrate surface 1 of the semiconductor substrate 10. The semiconductor substrate 10 includes a trench 4 with sidewall or trench surface 12. The trench 4 includes a first trench section I and a second trench section II, which is adjacent to the first trench section I. The boundary or transition between the first trench section I and the second trench section II is illustrated by the dashed line D. The first trench section I may, e.g., be a field oxide section. The second trench section II may, e.g., be a gate oxide section.

In FIG. 2A, the semiconductor device further includes a first insulating layer 20 arranged in a lower portion 13 of at least the first trench section I and the second trench section II. The first insulating layer 20 may include an upper surface 24 or upper end. The upper surface 24 is recessed with respect to the first substrate surface 1 and runs within the trench 4, i.e., at a certain distance from the first substrate surface 1. First insulating layer 20 therefore covers lower portion 13 of trench 4 while leaving upper portion 3 uncovered. The upper surface 24 or the upper end of the first insulating layer 20 defines the upper end of the lower portion 13 in this embodiment. The trench surface 12 is exposed in an upper portion 3 of the trench 4 above the upper surface 24. The first insulating layer 20 includes a lateral surface 22 running substantially parallel to the trench surface 12. In some embodiments, the first insulating layer 20 may be formed by thermal oxidization of the semiconductor substrate 10, wherein the first insulating layer is formed at least on the trench surface 12 at least in the first trench section I and the second trench section II. Alternatively, the first insulating layer 20 may be formed by deposition. Subsequently, according to embodiments described herein, the first insulating layer 20 is removed, for example, etched back, in the upper portion 3 adjacent to the substrate surface 1. Thereby, the trench surface 12 may be exposed in the upper portion 3. Etching back the first insulating layer 20 may include etching without a mask. Etching may include wet etching, e.g., chemical etching with $NH_4F$, HF or mixtures thereof, or by dry etching, e.g., anisotropic etching, e.g., with the help of an ion beam device.

The first insulating layer 20 may be a field oxide layer. In some embodiments, the first insulating layer 20 is formed by thermal oxidization, typically at high temperatures from 1000° C. to 1300° C., more typically from 1100° C. to 1200° C. such as, e.g., 1150° C. Alternatively, the first insulating layer 20 may be formed by deposition, e.g., by chemical vapour deposition. The first insulating layer may be a thermal oxide layer or, alternatively, a deposition oxide layer. The first insulating layer 20 may include at least one of the following materials: $SiO_2$, low-k materials, fluorine doped $SiO_2$, carbon doped $SiO_2$, porous $SiO_2$ forming voids or pores, porous carbon doped $SiO_2$. The first insulating layer 20 has a thickness sufficient to act as field insulating layer. Typically, the first insulating layer has a thickness of at least 0.05 μm, e.g., from 0.06 μm to about 2.0 μm.

If FIG. 2A was seen from above, this top view may, e.g., correspond to the area E in FIG. 1B, wherein FIG. 1B is an enlarged part of FIG. 1A illustrating only two trenches. FIG. 2A may also correspond to other semiconductor devices with trench structure.

Figure 2B:
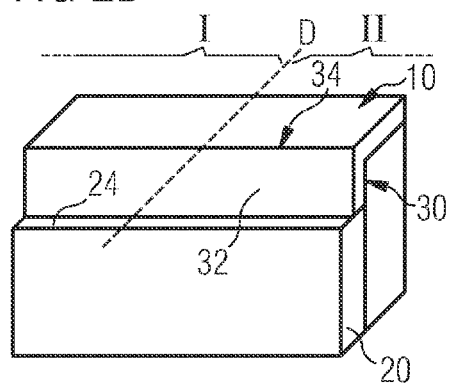

As illustrated in FIG. 2B, a second insulating layer 30 is formed at least on the exposed trench surface 12 in the upper portion 3 according to one or more embodiments. The second insulating layer 30 is arranged in the first trench section I and in the second trench section II and extends vertically from the upper end or upper surface 24 of the first insulating layer 20 at least to the first substrate surface 1, i.e., the second insulating layer 30 covers the trench surface 12 at least in the upper portion 3 of the trench. The second insulating layer 30 may also cover portions of the first substrate surface 1. The second insulating layer 30 includes an upper edge 34 and a lateral surface 32 running substantially parallel to the trench surface 12.

In FIG. 2B, the second insulating layer 30 has a substantially constant thickness in the longitudinal direction of the trench 4 at least in the first and second trench section. Because of the constant thickness in longitudinal direction, the second insulating layer 30 does not include a point-like or spot-like thinning of the second insulating layer 30, which could be a weak point of the insulation provided by the second insulating layer 30 and would lead to increased leakage currents. Typically the second insulating layer 30 is a thermal oxide layer formed by thermally oxidizing at least the exposed trench surface 12 in upper portion 3. The second insulating layer 30 typically has a substantially constant thickness at least at the transition between the first and second trench section. The second insulating layer 30 may be an unstructured layer at least in the transition region from the first to the second trench section, i.e. the second insulating layer 30 forms a continuous layer extending from the first section I to the second section II. The second insulating layer 30 may function as a gate dielectric layer in the second trench section II. The second insulating layer 30 may include at least one of the following materials: $SiO_2$, Oxinitride, $Si_3N_4$, high-k dielectrics. Typically, the second insulating layer 30 is made of $SiO_2$. In comparison to the first insulating layer 20, the second insulating layer 30 is thinner so that it can serve as gate insulating layer.

Figure 2C:
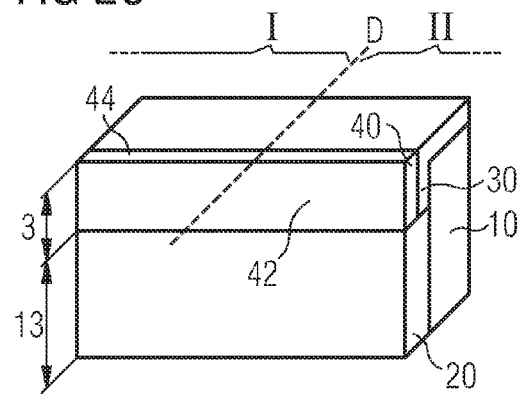

As illustrated in FIG. 2C, according to one or more embodiments, a conductive layer 40 is formed in trench 4 on the second insulating layer 30. Typically, the conductive layer 40 is a doped semiconductor layer, which may be as highly doped as to physically qualify rather as a conductor than as a semiconductor. However, the conductive layer 40 may be a metal layer, a semiconductor layer or be made of any other conductive material. The conductive layer 40 is arranged at least in the first trench section I and second trench section II and extends vertically from the upper surface 24 of the first insulating layer at least to the first substrate surface 1, i.e., it covers the second insulating layer 30 at least in the upper portion 3 of the trench. The conductive layer 40 may also cover portions of the first substrate surface 1 (see, e.g., FIG. 6), in particular on the second insulating layer 30 extending on the first substrate surface 1 (see, e.g., FIG. 5). The conductive layer 40 includes an upper surface 44 and a lateral surface 42. Typically, the conductive layer 40 is formed on or directly on the lateral surface 32 of the second insulating layer 30, e.g., by deposition. The conductive layer 40 may be formed by chemical vapour deposition, e.g., low pressure CVD. After deposition, the conductive layer 40 may be etched back to or just below the level of the substrate surface, e.g., by isotropic or anisotropic plasma etching, or isotropic wet-chemical etching. The conductive layer may include at least one of the following materials: polysilicon, highly doped polysilicon, n+ polysilicon, p+ polysilicon, Ti, TiN, W, or stacks thereof, or combinations thereof. The conductive layer may be a gate electrode, e.g., of a field effect transistor.

Figure 2D:
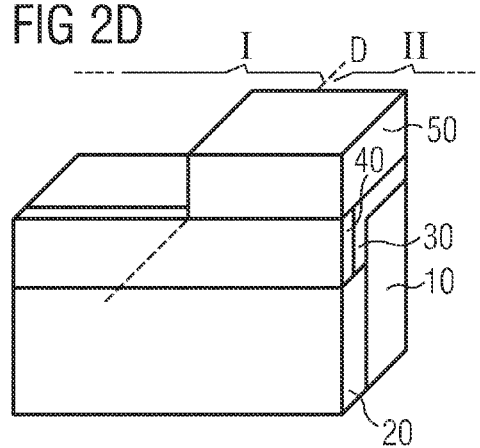

According to one or more embodiments, as illustrated in FIG. 2D, a mask 50 is formed on the first substrate surface 1. The mask 50 covers the second trench section II, but not the first trench section I. Typically, the mask 50 protects the conductive layer 40 from being removed in the second trench section II, e.g., in an etching process. The mask 50 may be a photolithographic mask.

Figure 2E:
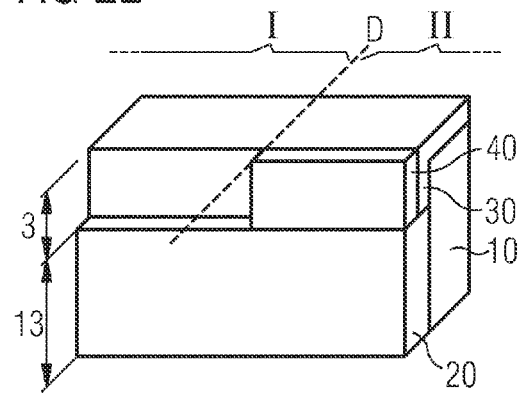

As illustrated in FIG. 2E, the conductive layer 40 is removed from the first trench section I but not in the second trench section II. Typically, the conductive layer 40 is removed by etching using the mask 50. Typically, the conductive layer 40 is removed by etching, e.g., isotropic or anisotropic plasma etching, or isotropic wet-chemical etching, or any combination thereof. The conductive layer 40 is typically etched selectively with respect to the material of mask 50 and the material of the first and second insulating layers. The mask 50 may be removed after an etching process.

In one or more embodiments, the conductive layer 40 forms a gate electrode in the second trench section II. The second insulating layer 30 may be a gate insulating layer. A gate electrode may be formed on the gate insulating layer 30 at least in the upper portion 3 of the first trench section I and the second trench section II, and the gate electrode may be removed in the first trench section I so that the gate electrode remains in the upper portion 3 of the second trench section II. The second trench section II may be a gate oxide section, while the first trench section I, where the gate electrode has been removed, may be a field oxide section.

Figure 2F:
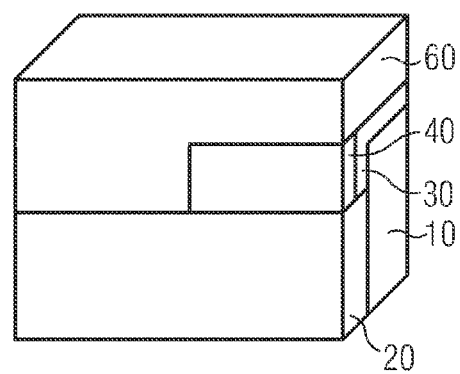

As illustrated in FIG. 2F, a third insulating layer 60 may be formed at least in the first trench section I according to embodiments described herein. The third insulating layer 60 extends in the first trench section I from the upper end or upper surface 24 of the first insulating layer at least to the first substrate surface 1. The third insulating layer 60 does not extend in the second trench section II since the upper portion 3 of the second trench section II is filled with the conductive layer 40. In FIG. 2F, the third insulating layer 60 also covers the first substrate surface 1 and the conductive layer 40. Typically, the conductive layer 40 is formed, in the first trench section I, on or directly on the upper surface 24 of first insulating layer 20 and on or directly on the lateral surface 32 of the second insulating layer 30. As it becomes more apparent from, for example, FIGS. 9-I and 9-II and 19-I and 19-II, respectively, third insulating layer 60 may have the same lateral thickness as conductive layer 40, since third insulating layer 60 fills the space formed by removing conductive layer 40.

In one or more embodiments, the third insulating layer 60 is formed by deposition. The third insulating layer 60 may be formed by chemical vapour deposition, e.g., low pressure CVD, sub atmosphere CVD, or plasma enhanced CVD. The third insulating layer 60 may be a deposition oxide layer. The third insulating layer may include several layers of different materials. The third insulating layer 60 may include at least one of the following materials: $SiO_2$, doped $SiO_2$, USG, PSG, BPSG, BSG, and combinations thereof. The third insulating layer 60 may have a substantially same thickness as the conductive layer 40 in the lateral direction within the trench.

According to one or more embodiments, source and body regions are formed in the semiconductor substrate. Typically, the source regions are embedded in respective body regions. Source and body regions may be formed by implantation. Implantation of body and/or source regions may include implanting with a mask or without a mask. Typically, implantation of body and/or source regions is carried out after deposition and etching back of the conductive layer 40. Implantation may be carried out through the second insulating layer 20 on the substrate surface. In another embodiment, the second insulating layer 20 may be removed in respective portions on the substrate surface, and a screen/scatter oxide or a screen/scatter nitride be formed on the exposed substrate surface after implantation. For example, in an n-channel device, the body regions may be p-type regions and the source regions n-type regions.

A source region 100 and body region 110 are illustrated in FIGS. 10-A, 11-A, 12-A, and 13-A, for example. However, a source region and/or a body region may be present in any embodiment disclosed herein, also in embodiments illustrated by Figures which do not explicitly illustrate such regions.

As described above, the second insulating layer 30 is formed as a continuous layer extending from the first to the second trench section. This means, that the second insulating layer 30 is also substantially homogeneous at the transition region between first and second trench section. Inhomogeneities of the thus formed second insulating layer 30 acting as gate insulating layer are significantly reduced or even avoided. This improves the reliability of the device since short-circuits between the conductive layer 40 acting as gate electrode and the semiconductor substrate, particularly the body region formed therein, are avoided. The breakdown voltage of the gate insulating layer is thus increased and the gate-source leak current reduced.

The location of the transition region between first and second trench section is mainly defined by mask 50 used to etch conductive layer 40. Third insulating layer 60 acting as field insulating layer merely fills the free space left after partial removal of conductive layer 40. The conductive layer 40 and third insulating layer 60 are formed and structured after formation of second insulating layer 30, so that its formation in not affected by any of these layers. A gate oxide region corresponding to the second trench section II is therefore defined after formation of the gate insulating layer.

The conductive layer 40 can generally be any conductive layer, which is structured and removed in the first trench section I.

In the following, Figures with no additional label illustrate structures which are present, at least at some stage during manufacturing of a semiconductor device, at least both in the first and second trench section at some cross-section, while Figures with additional labels "I" and "II" illustrate structures which are present, at least at some stage during manufacturing of a semiconductor device, only in the first or second trench section, respectively, at some cross-section. Further, Figures with additional labels "A", "B" or "C" illustrate cut views of structures which are present, at least at some stage during manufacturing of a semiconductor device, along the lines "A", "B" or "C" of FIG. 1A. This assignment shall not limit embodiments described herein to the specific geometry of a semiconductor device according to FIG. 1A.

FIGS. 3 to 13-C illustrate cut views through a trench of a semiconductor device at different stages of a method for manufacturing a semiconductor device according to one or more embodiments. Therein, the semiconductor device includes a field plate layer 70 extending vertically up to the first substrate surface 1. Such geometry is typically used, e.g., in power FETs suitable for application of voltages which are larger than about 75 V.

FIGS. 14 to 19-II illustrate cut views through a trench of a semiconductor device at different stages of a manufacturing method for manufacturing a semiconductor device according to one or more embodiments. Therein, the field plate layer 70 vertically extends only up to a certain distance from the first substrate surface. Such a field plate layer 70 will be referred to by "buried field plate layer". Such geometry is typically used, e.g., in power FETs suitable for application of voltages which are smaller than about 75 V.

In FIGS. 3 to 19-II, the plane of drawing is along the vertical and lateral direction, while the longitudinal direction of the trench points into and out of the plane of drawing.

Figure 3:
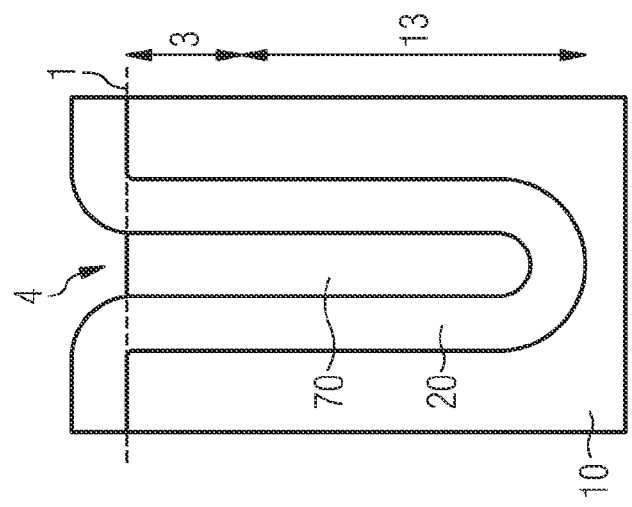

As illustrated in FIG. 3, the first insulating layer 20 is formed along and on the sidewalls of the trench, i.e. the trench surface, and also on the substrate surface 1, for example, by thermal oxidization or deposition. A field plate layer 70 is formed in the trench on the first insulating layer 20 at least in the first trench section I and in the second trench section II and typically completely fills trench 4, i.e. the space between inner sides of first insulating layer 20. The field plate layer 70 may be formed by deposition, and then be etched or polished back to the level of the first substrate surface 1 as illustrated in FIG. 3. The first substrate surface 1 is indicated by a dashed line in FIG. 3. The field plate layer 70 may be formed by chemical vapour deposition, e.g., low pressure CVD. In some embodiments, etching the field plate layer 70 includes maskless etching. The field plate layer 70 may include at least one of the following materials: polysilicon, highly doped polysilicon, n+ polysilicon, p+ polysilicon or combinations thereof. Polysilicon can be deposited as doped material or as undoped material, which is subsequently doped, for example, by depositing a BSG-layer and conducting a thermal treatment to diffuse boron from the BSG-layer into the polysilicon. In FIG. 3, the field plate layer 70 extends in the first trench section I and the second trench section II on the first insulating layer 20 from the lower portion of the trench substantially to the first substrate surface 1 after back etching.

Figure 4:
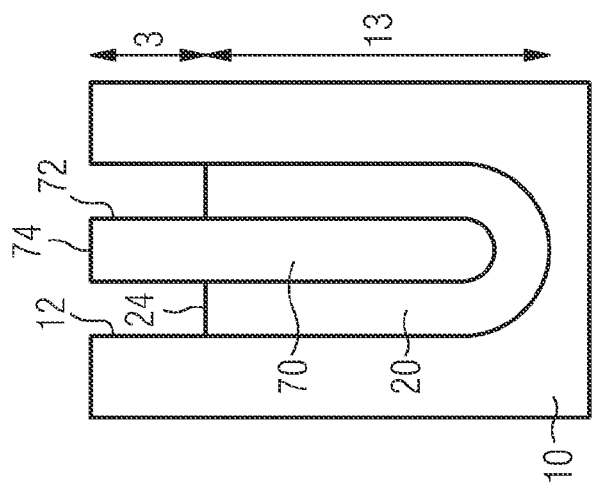

Typically, the first insulating layer 20 is then removed from the upper portion 3 in the first trench section I and in the second trench section II as illustrated in FIG. 4. Typically, by removing the first insulating layer 20 from the upper portion 3, a lateral surface 72 of the field plate layer 70 is exposed in the upper portion 3. The trench surface 12 may also be exposed in the upper portion 3. The upper portion 3 is typically located above, and extends from, the upper surface or upper edge 24 of the back-etched first insulating layer 20 and is typically adjacent to the first substrate surface 1. The upper surface 24 of the first insulating layer 20 is typically below the upper surface 74 of the field plate layer 70. In some embodiments, removing the first insulating layer 20 includes etching, typically maskless etching.

According to one or more embodiments, the method for manufacturing a semiconductor device therefore may include forming a centre semiconductor layer in the trench on the first insulating layer 20. The centre semiconductor layer may be a field plate layer 70 as described herein. In some embodiments, e.g., for power FET applications, the centre semiconductor layer is field plate electrode, which may be kept at source potential during operation. The centre semiconductor layer may be a source field plate electrode.

Figure 5:
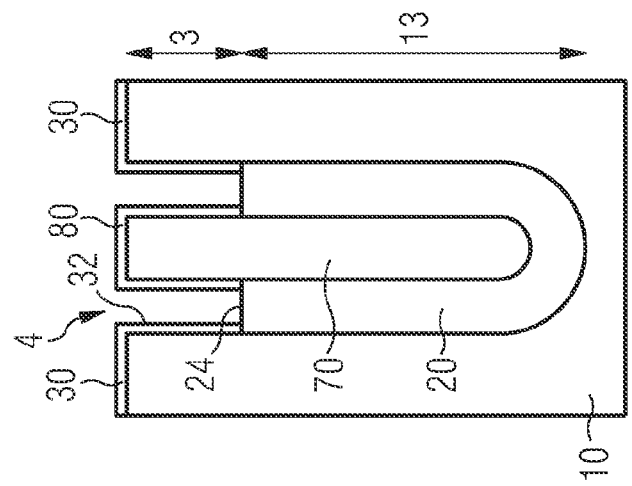

As illustrated in FIG. 5, a field plate insulating layer 80, which represents an instance of a fourth insulating layer here, is formed on the field plate layer 70, electrically insulating the field plate layer 70. Comparable to the second insulating layer 30, the field plate insulating layer 80 has a substantially constant thickness at least at the transition between the first trench section I and the second trench section II in the longitudinal direction. The field plate insulating layer 80 may have a substantially constant thickness in the longitudinal direction at least in the first trench section I and in the second trench section II. This means that point-like, particularly thin spots do not occur in the field plate insulating layer. The second insulating layer 30 as described above is formed, typically together with the field plate insulating layer 80.

Typically, the field plate insulating layer 80 and the second insulating layer 30 are formed by oxidizing the exposed surfaces 72 and 74 of the field plate layer and exposed surfaces of the semiconductor substrate 10. Therein, oxidizing typically includes thermal oxidizing. Oxidizing the exposed trench surface 12 and the exposed field plate layer 70 may be carried out at the same time. The field plate insulating layer 80 typically is an oxide layer formed by oxidizing a polycrystalline field plate layer 70. The second insulating layer 30 typically is an oxide layer formed by oxidizing the monocrystalline substrate 10. The field plate insulating layer 80 may be thicker than the second insulating layer 30 due to better oxygen diffusion into the polycrystalline structure, in particular if both layers are formed together. The field plate insulating layer 80 may include $SiO_2$.

Typically the conductive layer 40 is subsequently formed at least between, and in contact with, the second insulating layer 30 and the field plate insulating layer 80 as illustrated in FIGS. 6, 7, and 7-C.

As illustrated in FIG. 6, FIG. 7, and FIG. 7-C, the conductive layer 40 is formed at least in the second trench section II as described above. Typically, the conductive layer 40 is formed in the first trench section I and the second trench section II and is subsequently removed from the first trench section I so that the conductive layer 40 remains between the field plate insulating layer 80 and the second or gate insulating layer 30. In the second trench section II, the field plate insulating layer 80 is arranged between the conductive layer 40 and the field plate layer 70 and insulates both from each other. Further, the second insulating layer 30 is arranged between the conductive layer 40 and the semiconductor substrate 10 and insulates both from each other.

According to one or more embodiments, the conductive layer 40 is formed by deposition, e.g., illustrated in FIG. 6. Typically, the conductive layer 40 is deposited in the first trench section I and the second trench section II. In one or more embodiments, the conductive layer 40 is etched. Typically, the conductive layer 40 is etched with a mask. In FIG. 7, embodiments are illustrated, in which the upper surface 44 of the conductive layer 40 is etched back to about the level of the first substrate surface 1. In FIG. 7-C, in which the conductive layer 40 extends above the first substrate surface 1 in a region above the trench 4. Typically, a gate contact region 41 as illustrated in FIG. 7-C is formed in an area of trench 4, where the conductive layer 40 is to be contacted. For example, in a power FET where the conductive layer 40 is a gate electrode, a gate contact region 41 as in FIG. 7-C is formed in an area of the trench for gate contacting. According to embodiments illustrated in FIG. 1A, the gate contact region 41 as in FIG. 7-C may be formed in an area along the dashed line C.

According to one or more embodiments, a source region and a body region may be formed in the semiconductor substrate 10 at this stage. Typically, the source region is embedded in the body region in the semiconductor substrate. The body region may be formed by implantation. The source region may be formed by implantation. For example, in an n-channel device, the body region may be a p-type region and the source region an n-type region. Body and source regions may also be formed at later stages.

A source region 100 and body region 110 are illustrated in FIGS. 10-A, 11-A, 12-A, and 13-A. However, a source region and/or a body region may be present in any embodiment disclosed herein, also in embodiments illustrated by Figures, which do not explicitly illustrate such regions.

As described above, the conductive layer 40 is removed in the first trench section I but not in the second trench section II. Typically, the conductive layer 40 is etched with a mask 50 as illustrated in FIGS. 8-I, 8-II and 8-C. A mask 50, e.g., a photolithographic mask, is formed on the first substrate surface 1 in the second trench section II as illustrated in FIGS. 8-II and 8-C, but not in the first trench section I. The conductive layer 40 is removed in the first trench section I as illustrated in FIG. 8-I. In the second trench section II, the conductive layer 40 is protected by the mask 50. The mask 50 is removed after etching. The substrate between the trenches, i.e. mesa structure 6, is typically not etched in this area if it is masked by gate oxide or screen/scatter oxide.

As described above, a third insulating layer 60 is formed. The third insulating layer 60 is formed at least in the first trench section I as illustrated by FIG. 9-I. The third insulating layer 60 may be formed in and on the first trench section I and on the second trench section II as illustrated by FIGS. 9-I, 9-II and 9-C. FIG. 9-C may illustrate a cut view along the dashed line C in FIG. 1A. The third insulating layer 60 is typically a deposition oxide layer formed by deposition of an oxide.

In the following, according to one or more embodiments, the formation of at least one contact is described with respect to FIGS. 10-A to 13-C. Contact structures for contacting at least one of source, body, gate, and field plate may be formed. The contact structures may be formed separately if desired, for example, to tailor individually the contact structures. In one or more embodiment, the contact structures are formed by common process to reduce manufacturing costs.

Typically, body and source are contacted by a common contact structure being in electrical contact with a source metallization. In other embodiments, source region 100 and body region 110 have separate contacts. In the embodiments described herein, the conductive layer 40 is electrically contacted to a gate pad or to gate fingers. Typically, the conductive layer is a gate electrode and the conductive layer contact is a gate contact. The field plate 70 is contacted to the source metallization using a contact structure different from the contact structure of body and source.

According to one or more embodiments, a mask 90 is applied on the third insulating layer 60, the mask defining an exposed surface area of the third insulating layer 60 above the source region 100, respectively above the body region 110, as illustrated in FIG. 10-A, or above the field plate layer 70 as illustrated in FIG. 10-B, or above gate contact region 41 of conductive layer 40 as illustrated in FIG. 10-C. FIG. 10A illustrates a cross-section of two adjacent trenches with a mesa structure 6 therebetween. The third insulating layer 60 is removed from the regions not covered by the mask 90, e.g., by etching. Further, using the mask 90, the second insulating layer 30 is partially removed exposing the upper surface of the source region 100 as illustrated in FIG. 11-A. Furthermore, the fourth insulating layer 80 is partially removed using the mask 90 exposing the upper surface of the field plate layer 70 as illustrated in FIG. 11-B. By removing the third insulating layer 60, the upper surface of gate contact region 41 of conductive layer 40 is exposed in an contact area as illustrated in FIG. 11-C. The mask 90 may be removed. A contact recess is formed in the source region 100 below the area where it is exposed, e.g., by etching, and also in the body region 110 as illustrated in FIG. 12-A. The field plate layer 70 is partly removed below the area where it is exposed and a contact recess formed therein as illustrated in FIG. 12-B. The conductive layer 40 is partly removed in the contact area of gate contact region 41 to form a contact recess as illustrated in FIG. 12-C.

In one or more embodiments, highly doped contact regions are implanted in the exposed portions of semiconductor substrate 10, field plate layer 70 and/or conductive layer 40, using either mask 90 or third insulating layer 60 as implantation mask, to reduce contact resistance. Typically, a plug 120A, a plug 120 B and a plug 120C, respectively, are formed of a conductive material, e.g., a semiconductor material such as polysilicon. The plug 120A, the plug 120B, the plug 120C, respectively, may be contacted by metal, e.g., by a first metal layer 130A, 130B, 130C, a second metal layer 140A, 140B, 140C and third metal layer 150A, 150B, 150C as illustrated in FIGS. 13-A to 13-C. The metal layers may be structured, e.g., by etching, to form, e.g., separate portions such as a gate metallization or a source metallization, possibly including gate fingers or source fingers. Typically, metal layers 130A, 130B, 140A, 140B, 150A, and 150B form a source metallization, and metal layers 130C, 140C, and 150C form a gate metallization. The first metal layer 130A, 130B, 130C, the second metal layer 140A, 140B, 140C and the third metal layer 150A, 150B, 150C may, e.g., include at least one of the following: Ti, TiN, W, AlCu, AlSiCu, TiW, Cu, or combinations thereof. In other embodiments no plug 120A, 120B, 120C is provided. Instead a pure metal contact is provided.

According to one or more embodiments, a method for manufacturing a semiconductor device therefore may include forming at least one of: a source contact, a body contact, a field plate contact, a conductor region contact or any combination thereof. The conductor region may be a gate electrode and the conductor region contact may be a gate contact.

In one or more embodiments, the semiconductor device includes a second substrate surface. Typically, the second substrate surface is a back surface opposite to the first substrate surface 1. The second substrate surface may be an outer surface of a drain region, e.g., of a wafer on which the epitaxial layer is formed. The second substrate surface may be contacted with a metal contact. Typically, such a metal contact is a drain contact. In case of an IGBT, the emitter region may be contacted by the metal contact.

Figure 15:
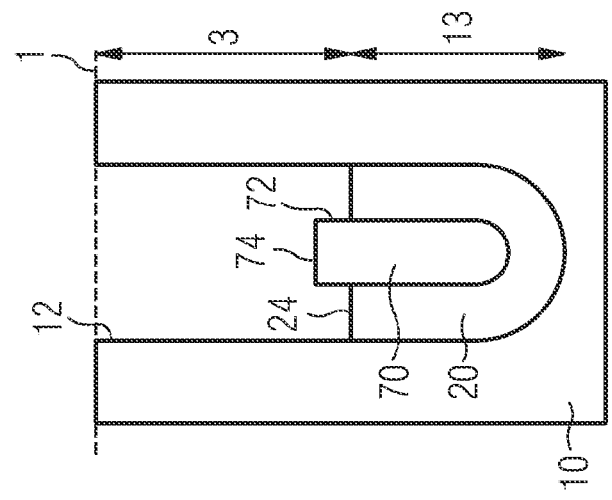
Figure 14:
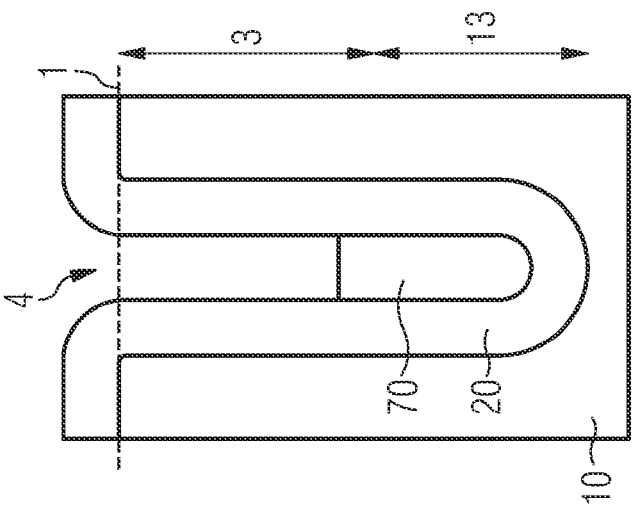

FIGS. 14 and 15 illustrate variants of the embodiments described with respect to FIGS. 3 and 4 featuring a buried field plate layer. As illustrated in FIG. 14, a field plate layer 70 is formed. The field plate layer 70 extends in the second trench section II on the first insulating layer 20 from the lower portion 13 of the trench into the upper portion 3 of the trench, however not all the way up to the first substrate surface 1. The field plate layer 70 may be deposited on the first insulating layer 20 and be etched back. The field plate layer 70 may form a buried field plate electrode. In the first trench section I, the field plate layer 70 may extend, at least in certain areas, on the first insulating layer 20 from the lower portion 13 of the trench to the first substrate surface 1. Such areas in the first trench section I may serve for contacting the field plate layer. FIGS. 3 and 4, respectively, can be considered as illustrating a cut view through such an area. A profile of the field plate layer as described herein may, according to some embodiments, be formed by etching with a mask, e.g., by photolithographic etching.

Figure 16:
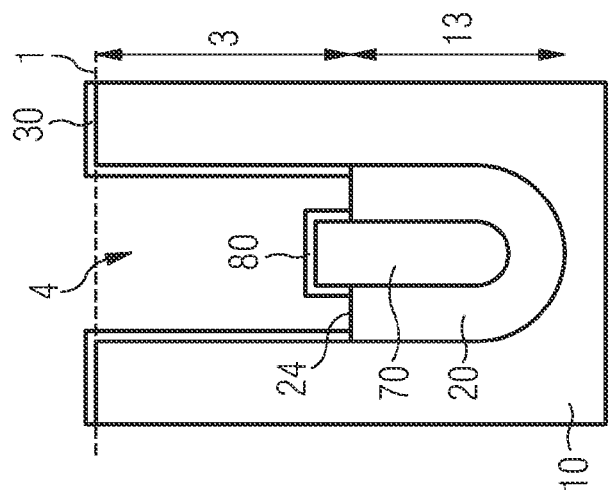

FIG. 16 illustrates the forming of the second insulating layer 30 and the field plate insulating layer 80 as described with respect to FIG. 5, typically by thermal oxidization. Typically, as illustrated in FIG. 17, the conductive layer 40 is subsequently formed at least between the second insulating layer 30 and the field plate insulating layer 80 at least in the second trench section II. Typically, the conductive layer 40 is formed at least in the first trench section I and the second trench section II. The conductive layer 40 is formed above the field plate layer 70 and buries the field plate layer 70 as illustrated in FIG. 17. In some area or areas, e.g., in an area in the first trench section I, where a contact to the buried field plate layer 70 is to be formed, the field plate layer 70 may extend to the first substrate surface as illustrated, e.g., in FIG. 7.

As described above, the conductive layer 40 is typically formed by etching with a mask 50 covering the second trench section II, as illustrated in FIG. 18-II, but not the first trench section I as illustrated in FIG. 18-I. The conductive layer 40 is typically removed from the first trench section I by the etching process.

After removing mask 50, a third insulating layer 60 may be formed in embodiments with buried field plate layer 70 in a similar way as described above. FIG. 19-I illustrates the third insulating layer 60 filling the trench in the first trench section I where the conductive layer 40 was removed and extending also on the substrate surface. FIG. 19-11 illustrates the third insulating layer 60 in the second trench section II. While FIGS. 10-A to 13-C illustrate embodiments with a field plate layer 70 extending to the first substrate surface 1, contacts may be formed in embodiments with buried field plate layer 70 in a similar way.

While the Figures have been described as illustrations for a method of manufacturing a semiconductor device according to one or more embodiments, the same Figures may also illustrate a semiconductor device according to embodiments described herein. Semiconductor devices according to embodiments described herein, with or without reference to a Figure, may be manufactured according to embodiments of a method for manufacturing a semiconductor device described herein. However, the semiconductor devices according to one or more embodiments may be manufactured in any other way.

According to one or more embodiments, a semiconductor device is provided, e.g., a field effect transistor, diode, bipolar transistor or insulated gate bipolar transistor. Typically a semiconductor device for use in high power applications is provided, e.g., a power field effect transistor. The semiconductor device may be an n-channel or p-channel semiconductor device. In one or more embodiments, the semiconductor device includes a semiconductor substrate 10 including a first substrate surface 1. In one or more embodiments, the semiconductor substrate 10 includes at least one trench 4 with at least one trench surface 12. The at least one trench 4 typically extends from the first substrate surface 1 into the semiconductor substrate and extends in a longitudinal direction. In one or more embodiments, the at least one trench 4 includes a first trench section I and a second trench section II. Typically, the first trench section I is arranged longitudinally adjacent to the second trench section II. The first trench section I may include a trench end 4A of the at least one trench 4.

In one or more embodiments, the semiconductor substrate 10 includes an epitaxial semiconductor region, typically epitaxially grown on a wafer. In some embodiments, the trench extends from a first surface of the epitaxial semiconductor region into the epitaxial semiconductor region.

According to one or more embodiments, the first trench section I is field oxide section. Typically, there is no gate electrode layer in the field oxide section. In some embodiments, the second trench section II is a gate oxide section. In one or more embodiments, there is a gate electrode layer in the gate oxide section. The gate oxide section and the field oxide section typically have a common transition region, sometimes called a gate/field oxide junction.

In one or more embodiments, the semiconductor device includes a first insulating layer 20. Typically, the first insulating layer 20 runs at least in the first trench section I and the second trench section II. In one or more embodiments, the first insulating layer 20 covers the trench surface 12 in a lower portion of the first trench section I and the second trench section II. In one or more embodiments, the first insulating layer 20 is a deposition oxide layer. According to one or more embodiments, the first insulating layer 20 is field oxide layer.

In one or more embodiments, the semiconductor device includes a second insulating layer 30. Typically, the second insulating layer 30 runs at least in the first trench section I and the second trench section II. Also, typically, the second insulating layer 30 covers the trench surface 12 in an upper portion 3 of the first trench section I and the second trench section II. In one or more embodiments, the second insulating layer 30 is thinner than the first insulating layer 20. The second insulating layer 30 may be a substantially vertical layer, typically if the trench surface 12 includes a substantially vertical sidewall. In one or more embodiments, the second insulating layer 30 is a thermal oxide layer. A thermal oxide layer, which is formed by thermally oxidizing some other layer, typically has a constant thickness in any direction in which no obstruction occurs by another layer. According to one or more embodiments, the second insulating layer 30 is a gate oxide layer. The gate oxide layer may electrically insulate the epitaxial semiconductor region from a gate which is formed in the trench 4. According to one or more embodiments, the second insulating layer 30 has a constant thickness in the longitudinal direction at least at the transition between the first trench section I and the second trench section II, i.e. in the transition region between the first trench section I and the second trench section II. In one or more embodiments, the second insulating layer 30 has a constant thickness longitudinally along the trench 4 at least in the first trench section I and the second trench section II. If the second insulating layer is a gate oxide layer, it may have a constant thickness in longitudinal direction at least at the transition between the gate oxide section and the field oxide section of the trench. In some embodiments, there is no triple point of the second insulating layer 30 at the transition between the first trench section I and the second trench section II. A "triple point" as used herein refers to a point where the gradients of the thickness of a layer in the longitudinal and vertical direction are not substantially zero. In some embodiments, there is no triple point of the gate oxide layer at the gate/field oxide junction. A triple point may be a weak point of the semiconductor device. A triple point is formed, e.g., in a corner of a layer which restricts lateral growth of the thermal oxide layer in vertical and longitudinal direction. Second insulating layer 30 may have a reduced thickness at its lower edge facing the first insulating layer 20, since oxidation of the exposed semiconductor material at the upper edge of first insulating layer occurs at a reduced rate.

In forming a semiconductor device, avoiding such triple points is achieved, according to some embodiments, by forming a continuous gate insulating layer 30 running from the first to the second trench section. In case of formation by oxidization, the growth of the gate insulating layer 30 is not affected by other layers or structures at the transition between the first and the second trench section. The gate electrode 40 is formed and structured as described above. In case of the field plate layer 70, a continuous field plate insulating layer 80 is also formed, typically together with the gate insulating layer 30.

In one or more embodiments, the semiconductor device includes a conductive region 40, also referred to as conductor region 40 or as conductive layer 40. The conductive layer may also be a metal layer, a semiconductor layer or be made of any other conductive material. Without limiting the scope, the conductive layer is referred to as a conductor region 40 in the following. Typically, the conductor region 40 extends at least in the second trench section II. Also, typically, the conductor region 40 does not extend in the first trench section I. In one or more embodiments, the conductor region 40 is on the second insulating layer 30. In one or more embodiments, the conductor region 40 extends, in the vertical direction, in the upper portion 3 of the trench from the upper end or upper surface 24 the first insulating layer 20 at least to the first substrate surface 1. The conductor region 40 may be a substantially vertical layer, typically if the trench surface 12 includes a substantially vertical sidewall and/or the second insulating layer 30 is a substantially vertical layer.

According to one or more embodiments, the conductor region 40 is a gate electrode layer. Typically, the gate electrode layer is electrically insulated from the epitaxial semiconductor region by the gate oxide layer. The gate oxide layer and the field oxide layer may electrically insulate the epitaxial semiconductor region from the gate electrode layer.

In one or more embodiments, the semiconductor device includes a third insulating layer 60. Typically, the third insulating layer 60 extends at least in the first trench section I. Also, typically, the third insulating layer 60 does not extend in the second trench section II. In embodiments, the third insulating layer 60 is laterally on the second insulating layer 30 in the trench 4. In one or more embodiments, the third insulating layer 60 extends, in the vertical direction, in the upper portion 3 of the trench 4 from the upper edge or upper surface 24 of the first insulating layer 20 at least to the first substrate surface 1. The third insulating layer 60 may be a substantially vertical layer in the first trench section I, typically if the trench surface includes a substantially vertical sidewall and/or the second insulating layer 30 is a substantially vertical layer. According to one or more embodiments, the third insulating layer 60 is a deposition oxide layer.

According to further embodiments, a semiconductor device includes at least one of: a source contact, a body contact, a field plate contact, a conductor region contact or any combination thereof. The conductor region 40 may be a gate electrode and the conductor region contact may be a gate contact.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modification within the spirit and scope of the claims. Especially, mutually non-exclusive features of the embodiments described above may be combined with each other. The patentable scope is defined by the claims and may include other examples that occur to those skilled in the art. Such other examples are intended to be within the scope of the claims if they have structural elements, which do not differ from the literal language of the claims, or if they include equivalent structural elements with insubstantial differences from the literal languages of the claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
  a semiconductor substrate comprising a first substrate surface and at least one trench comprising at least one trench surface, the trench extending from the first substrate surface into the semiconductor substrate, in a longitudinal direction and comprising a first trench section and a second trench section which is arranged adjacent, in the longitudinal direction, to the first trench section;
  a first insulating layer covering the trench surface in a lower portion of the first and second trench sections;
  a second insulating layer covering the trench surface in an upper portion of the first and second trench sections, the second insulating layer being thinner than the first insulating layer;
  a conductor region on the second insulating layer in the second trench section, the conductor region extending from an upper surface or edge of the first insulating layer at least to the first substrate surface; and
  a third insulating layer on the second insulating layer in the first trench section, the third insulating layer extending from an upper surface or edge of the first insulating layer at least to the first substrate surface.

2. The semiconductor device of claim 1, comprising wherein the first insulating layer is a thermal oxide layer.

3. The semiconductor device of claim 1, comprising wherein the second insulating layer is a thermal oxide layer.

4. The semiconductor device of claim 1, comprising wherein the third insulating layer is a deposition oxide layer.

5. The semiconductor device of claim 1, wherein the second insulating layer comprises a constant thickness in the longitudinal direction at least at the transition between the first and second trench sections.

6. The semiconductor device of claim 1, further comprising:
  a field plate region in the first and second trench sections, the field plate region extending from the upper portion into the lower portion and being adjacent to the first insulating layer; and
  a fourth insulating layer being arranged in the upper portion of the first trench section between the third insulating layer and the field plate region and in the upper portion of second trench section between the conductor region and the field plate region.

7. The semiconductor device of claim 6, wherein the fourth insulating layer comprises a constant thickness in the longitudinal direction at least at the transition between the first and second trench section.

8. The semiconductor device of claim 6, comprising wherein the fourth insulating layer is a thermal oxide layer.

9. A semiconductor device, comprising:
  a semiconductor substrate comprising a first substrate surface and at least one trench comprising at least one trench surface, the trench extending from the first substrate surface into the semiconductor substrate, in a longitudinal direction and comprising a first trench section and a second trench section which is arranged adjacent, in the longitudinal direction, to the first trench section;
  a first insulating layer covering the trench surface in a lower portion of the first and second trench section, the first insulating layer being a thermal oxide layer;
  a second insulating layer covering the trench surface in an upper portion of the first and second trench section, the second insulating layer being a thermal oxide layer thinner than the first insulating layer;
  a conductor region on the second insulating layer in the second trench section, the conductor region extending from an upper end of the first insulating layer at least to the first substrate surface; and
  a third insulating layer on the second insulating layer in the first trench section, the third insulating layer extending from an upper end of the first insulating layer at least to the first substrate surface, the third insulating layer being a deposition oxide layer.

* * * * *